US006934194B2

(12) United States Patent
Takahashi et al.

(10) Patent No.: US 6,934,194 B2
(45) Date of Patent: Aug. 23, 2005

(54) NONVOLATILE MEMORY HAVING A TRAP LAYER

(75) Inventors: Satoshi Takahashi, Kawasaki (JP); Minoru Yamashita, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/631,812

(22) Filed: Aug. 1, 2003

(65) Prior Publication Data

US 2004/0027858 A1 Feb. 12, 2004

(30) Foreign Application Priority Data

Aug. 12, 2002 (JP) ....................................... 2002-234463

(51) Int. Cl.[7] ................................................ G11C 16/04

(52) U.S. Cl. ............................ 365/185.29; 365/185.28; 365/185.03

(58) Field of Search ....................... 365/185.29, 185.03, 365/185.28

(56) References Cited

U.S. PATENT DOCUMENTS 6,331,951 B1 * 12/2001 Bautista, et al. ....... 365/185.22
6,493,261 B1 * 12/2002 Hamilton et al. ...... 365/185.11

* cited by examiner

*Primary Examiner*—Hoai Ho
(74) *Attorney, Agent, or Firm*—Arent Fox PLLC

(57) ABSTRACT

A nonvolatile memory has a plurality of memory cells, each of the memory cells having a first and a second source/drain areas, a control gate, and an insulating trap layer disposed between the control gate and a channel area lying between the first and the second source/drain areas. The trap layer includes a use bit area in proximity to the first source/drain area, for storing data depending on the presence or absence of electric charge to be trapped, and a non-use bit area in proximity to the second source/drain area, in which the electric charge is trapped while data is held in the use bit area. Preferably, in the state where erasing operation is completed, the non-use bit area is brought into a state where electric charge is trapped therein.

16 Claims, 17 Drawing Sheets

A. WRITE OPERATION

B. ERASE OPERATION

C. READ-OUT OPERATION

NONVOLATILE MEMORY OF EMBODIMENT

NONVOLATILE MEMORY HAVING A TRAP LAYER

CROSS-REFERENCE TO RELATED APPLICATIONS

This application is based upon and claims the benefit of priority from the prior Japanese Patent Application No. 2002-234463, filed on Aug. 12, 2002, the entire contents of which are incorporated herein by reference.

BACKGROUND OF THE INVENTION

1. Field of the Invention

The present invention relates generally to a nonvolatile memory having a trap layer for trapping electric charge, and more particularly to a nonvolatile memory with various characteristics improved.

2. Description of the Related Art

There are two types in the flash memory, which is one of semiconductor nonvolatile memories, one type having a conductive floating gate enclosed within an oxide film between a control gate and a semiconductor substrate, and the other type, where an oxide film, a nitride film and an oxide film are formed between the control gate and the semiconductor substrate, and the nitride film, that is an insulating film, functions as a trap layer. Of the above-described two types, the latter stores the data 0 and 1, allowing the trap layer formed of the insulating film (or a trap gate) to trap electric charge for changing the threshold value of a cell transistor. As the trap layer is of insulating properties, electric charge cannot move through the interior of the trap layer. Therefore, the trap layer can accumulate electric charge in its both ends, so that two bits information can be stored.

FIG. 1 is a sectional view of a nonvolatile memory cell having a trap layer. On the surface of a P-type semiconductor substrate SUB, a first and a second source/drain areas SD1 and SD2 of N-type are provided, and on a channel area sandwiched between the SD1 and SD2, a silicon oxide film OX1, a silicone nitride film TRP, a silicon oxide film OX2, and a conductive control gate CG are formed in that order. The silicone nitride film OX2 can, as the trap layer, accumulate electric charge in the areas in its both ends, respectively (noted by black circles). One of the first and second source/drain areas SD1 and SD2 functions as a source, and the other functions as a drain or one functions as a drain, and the other functions as a source, depending on operations.

FIG. 2 is a diagram showing operations of a nonvolatile memory cell having a trap layer. During writing operation, the trap layer is allowed to trap a hot electron generated in the channel, after, for example, 9V is applied to the control gate, for example, 5V is applied to the first source/drain SD1, and further, for example, 0V is applied to the second source/drain SD2 and the substrate, respectively. By the injection of the channel hot electron, an electron is injected into the right-hand end of the trap layer. During erasing operation, for example, −6V is applied to the control gate, and for example, 6V is applied to the first source/drain SD1, respectively, and further the second source/drain SD2 is brought into a floating state, such that holes generated in the tunnel current between bands and flowing into the substrate from the first source/drain SD1 are injected into the trap layer. By this injection, the holes are neutralized with the electron trapped in the trap layer, and any electron no longer remains within the trap layer. In the erasing operation, the first and the second source/drains may the same potential (6V). In this case, the holes generated from both sides is injected into the trap layer.

During read-out operation, the voltage in the opposite direction to the direction employed during the writing operation is applied between the first and the second source/drains. This is a so-called reverse read. 0V and 5V for example are applied to the first source/drain SD1 and to the second source/drain SD2, respectively, and further, for example, 5V is applied to the control gate. At this time, if the electron is trapped at the right-hand end of the trap layer, the channel would not be formed, and the drain current would not flow, however, if any electron is not trapped at the side, the channel is formed and the drain current flows. Thus, the data can be read out.

If the trap layer accumulates electrons at its left-hand end, the relation between the first and the second source/drains SD1 and SD2 shown in FIG. 2 is reversed.

As described above, in nonvolatile memory having an insulating trap layer, as the memory cell can accumulate the data of 2 bits, it is expected that this memory cell can be used as a multi-bit memory cell. On the other hand, the cell structure having an insulating trap layer has a merit that its manufacturing process can be simpler, compared to the cell structure having a conductive floating gate.

Now, it has been proposed that, in nonvolatile memory having an insulating trap layer, only one end of the trap layer to be used as an accumulation area of electrons, and also as a 1 bit storing memory cell.

In this proposal, only one side of the trap layer is used for a data accumulation area, such that the opposite side of the trap layer is always kept in the erase state. The reason is as follows. If electrons are injected into the area on the opposite side, which is not used as memory, the threshold voltage of the cell transistor increases, thus causes the problem of increasing the read-out voltage in reading-out data on the side, which is to be used as memory. Furthermore, in order to inject an electron into the area on the opposite side which is not used as memory, writing (program) operation for that purpose is required, thereby causing another problem of complicating the data rewriting operation.

FIG. 3 is a flow chart of erasing operations of the conventional memory according to the above-described proposal. In FIG. 3, black circles indicate trapped state of the electrons of the cell transistor at each step, as well as a flow chart. Here, the right-hand end of the trap layer is the bit to be used as memory, and the left-hand end is the bit that is not used.

At the erasing start point S1, the electrons are not trapped, or are trapped on the right-hand end of the trap layer. Therefore, in erasing operation, first of all, pre-erase writing process is performed (S2). This process injects electrons into both ends of the trap layer. Then, erasing process S3 as shown in FIG. 2 is performed, and the holes are injected into both ends of the trap layer, and both of the use bit side and non-use bit side are brought, into the erased state. Through writing operation performed after that, an electron is injected into the use bit side.

As described above, in nonvolatile memory having a trap layer of the conventional 1 bit storing type, the non-use bit side is always kept in the erased state, and the non-use bit side is put in the erased state, even when a series of erasing operations have ended.

However, the inventors of the present invention have found that there is the following problem, when a nonvolatile memory cell having a trap layer is used as a 1-bit storage.

FIG. 4 is a diagram showing the relation between the writing time and the threshold voltage Vth. In nonvolatile memory in which electric charge is stored in the trap layer for storing data, the threshold voltage of the non-use bit on the opposite side considerably affects the threshold voltage of the use bit. Therefore, the threshold voltage of the use bit varies depending on the state, whether it is the (written state), where an electron is trapped in the non-use bit on the opposite side, or (erased state), where an electron is not trapped. In short, the threshold voltage becomes higher when the non-use bit on the opposite side is in the written state.

With the increase in the threshold voltage, the writing time of the use bit is affected. As shown in FIG. 4, at the writing start point, the threshold voltage when the bit on the opposite side is in the written state WR is higher than the threshold voltage in the erased state ER, and also, the time required for reaching a specified threshold voltage Vt1 is faster when the bit on the opposite side is in the written state WR, compared to the erased state ER. Therefore, if the bit on the opposite side is in the written state, the writing time of the use bit can be shortened.

FIG. 5 is a diagram showing the relation between the data holding time and the threshold voltage Vth. This figure shows that, when the data holding time is zero, that means immediately after writing, a threshold voltage is the predetermined voltage Vt1, however, as the data holding time is lasting longer, the threshold voltage drops largely, if the bit on the opposite side is in the erased state ER; on the other hand, the threshold voltage drops slightly, if the bit on the opposite side is in the written state WR. This means that if electrons are accumulated on the bit on the opposite side too, the ratio of dropping of the threshold voltage of the use bit side, caused by the electrons accumulated on the use bit being extracted, is lower than when the electrons are not accumulated on the bit on the opposite side.

In addition, FIG. 6 is a diagram showing the relation between the rewriting number of times and the amount of charge loss. This figure shows that with the increase in the rewriting number of times, the reducing amount of the charge (electron) within the trap layer increases. That is because of deterioration caused by the increase in the electric field stress applying number of times to the first oxide film OX1 (see FIG. 1), along with the increase in the rewriting number of times.

SUMMARY OF THE INVENTION

It is therefore an object of the present invention to provide a nonvolatile memory having a trap layer for performing 1-bit storage with reduced writing time and improved data holding characteristics.

Another object of the present invention is to provide a nonvolatile memory having a trap layer for performing 1-bit storage, capable of restricting the amount of charge loss, that is dependent on the rewriting number of times.

In order to achieve the above objects, according to a first aspect of the present invention there is provided a nonvolatile memory comprising a plurality of memory cells, each of the memory cells having a first and a second source/drain areas, a control gate, and an insulating trap layer disposed between the control gate and a channel area lying between the first and the second source/drain areas, wherein the trap layer includes a use bit area in proximity to the first source/drain area, for storing data depending on the presence or absence of electric charge to be trapped, and a non-use bit area in proximity to the second source/drain area, in which the electric charge is trapped while data is held in the use bit area. Preferably, in the state where erasing operation is completed, the non-use bit area is brought into a state where electric charge is trapped therein.

In accordance with the aspect of the present invention, in the erasing operation completed state, the electric charge is trapped in the non-use bit area. Therefore, in the writing operation to the use bit area performed after that, the writing time is shortened. Furthermore, in the data holding state after writing operation, as the electric charge is at all times trapped in the non-use bit area, the degree of dropping of the threshold voltage when the electric charge is trapped in the use bit area can be suppressed.

To attain the above objects, according to a second aspect of the present invention there is provided a nonvolatile memory comprising a plurality of memory cells, each of the memory cells having a first and a second source/drain areas, a control gate, and an insulating trap layer disposed between the control gate and a channel area lying between the first and the second source/drain areas, wherein the trap layer includes a use bit area in proximity to the first source/drain area, for storing data depending on the presence or absence of electric charge to be trapped, and a non-use bit area in proximity to the second source/drain area, in which the electric charge is trapped before writing operation to the use bit area.

In a more preferred example in accordance with the second aspect of the present invention, when writing is performed in the use bit area, writing is also performed in the non-use bit area of the same trap layer. Accordingly, the data holding characteristic when the electric charge is trapped in the use bit area can be enhanced, and furthermore, by limiting of the writing operation into the non-use bit area to the memory cell where the use bit area is written writing process into the non-use bit area can be reduced. In this case, if writing into the use bit area is performed after writing in the non-use bit area is performed, the writing characteristic can be improved.

To accomplish the above objects, according to a third aspect of the present invention there is provided a nonvolatile memory comprising a plurality of memory cells, each of the memory cells having a first and a second source/drain areas, a control gate, and an insulating trap layer disposed between the control gate and a channel area lying between the first and the second source/drain areas, wherein the trap layer includes a use bit area disposed in proximity to one of the first and the second source/drain areas, the use bit area storing data depending on the presence or absence of electric charge to be trapped, and a non-use bit area disposed in proximity to the other of the first and the second source/drain areas, the non-use bit area being not in use for storing data, and wherein the use bit area and the non-use bit area of the trap layer are switched at every specified number of rewriting operations.

In accordance with the above aspect of the present invention, the first and the second areas in close proximity of the first and the second source/drain areas of the trap layer, respectively, are allocated to the use bit area and the non-use bit area, and as the allocations are interchanged every rewriting of a specified number of times, the rewriting number of times to the first and the second areas can be reduced (to be more specific, reduced by half). Therefore, the increase in the amount of charge loss within the trap layer caused by the increase in the rewriting number of times can be restricted.

In the third aspect of the present invention, a more preferred embodiment includes a use bit determining memory for storing the use bit area. When the use bit area and the non-use bit area are replaced, the data of use bit determining memory has to be rewritten. Therefore, during read-out operation, writing operation, and erasing operation, whereabouts the use bit area is located can be judged by checking of use bit determining memory.

BRIEF DESCRIPTION OF THE DRAWINGS

The above and other objects, aspects, features and advantages of the present invention will become more apparent from the following detailed description when taken in conjunction with the accompanying drawings, in which.

DESCRIPTION OF THE PREFERRED EMBODIMENTS

Preferred embodiments of the present invention will now be described with reference to the accompanying drawings. It is however to be noted that the protective range of the present invention is not limited to the following embodiments but extends up to the invention as defined in claims and equivalents thereof.

Figure 1:
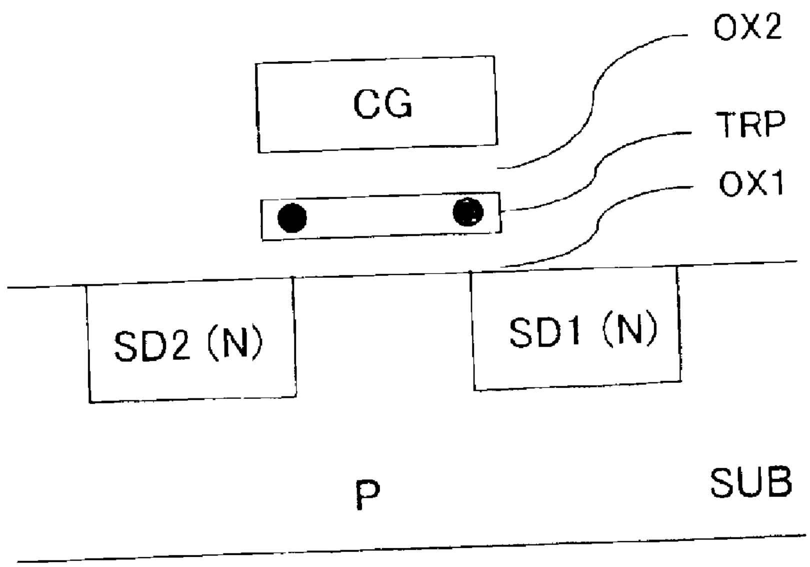
FIG. 1 is a cross-sectional view of a nonvolatile memory cell having a trap layer.
Figure 7:
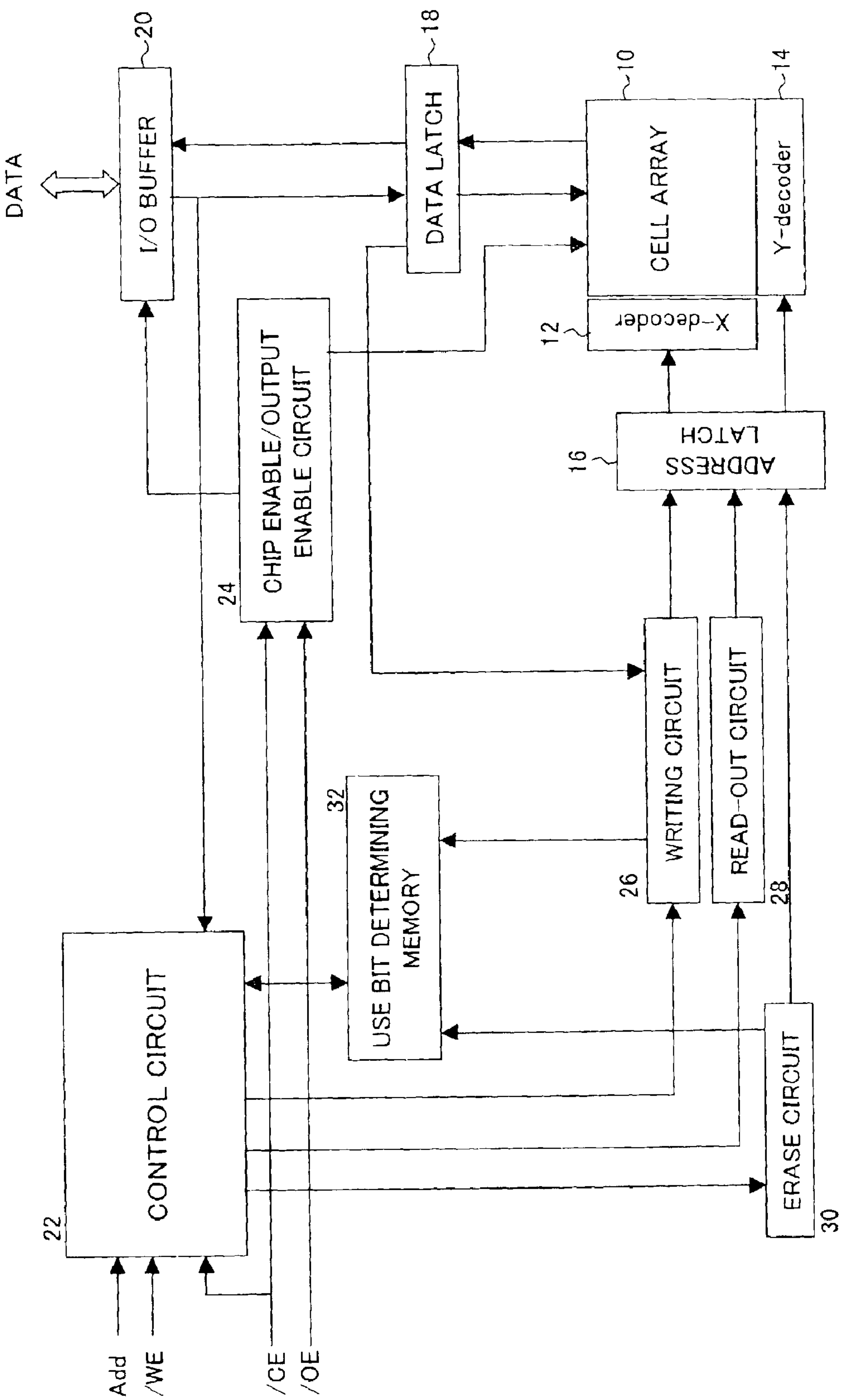
FIG. 7 is a diagram showing a configuration for nonvolatile memory in an embodiment according to the present invention.

FIG. 7 is a diagram showing the structure of nonvolatile memory in accordance with an embodiment of the present invention. This memory comprises a cell array 10 having a plurality of nonvolatile memory cells with a trap layer as shown in FIG. 1, an X decoder 12, a Y decoder 14, and an address latch circuit 16 corresponding to these decoders. The cell array 10 has a plurality of sectors, based on each of which erasing is effected. Also, the cell array includes a data latch circuit 18 for latching the data read out of the cell array, or the written data, and an I/O buffer 20 for entering data written from the outside, and outputting the read-out data to the outside. A chip enable/output enable circuit 24 controls the I/O buffer 20.

In addition, a control circuit 22 is provided for controlling the writing operation, erasing operation and reading operation of memory, and this control circuit 22 controls corresponding operation, in response to the command supplied from the individual external terminal of control signals/WE, /CE, and /OE, an address Add, and data DATA, respectively. In response to the control of the control circuit 22, a writing circuit 26, a read-out circuit 28, and an erase circuit 30 perform corresponding operations to the memory cell array 10.

Furthermore, in the embodiment according to the present invention, use bit determining memory 32 is provided. This use bit determining memory 32 stores data that indicates which side of the trap layer of the memory cell is the use bit area or non-use bit area. Therefore, where the use bit area and the non-use bit area are replaced in an embodiment as described later, the use bit area is confirmed by checking of this use bit determining memory 32. When the use bit area and the non-use bit area are replaced, the data of this use bit determining memory 32 is rewritten.

(First Embodiment)

Figure 8:
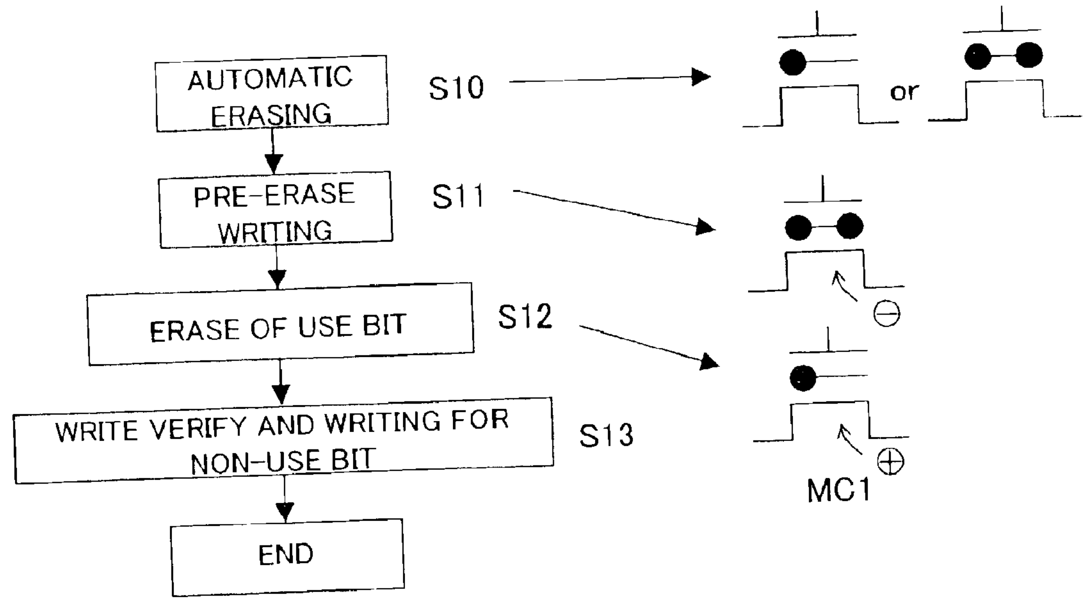
FIG. 8 is a flow chart of an automatic erasing operation in a first embodiment.

FIG. 8 is a flow chart of an automatic erasing operation in a first embodiment according to the present invention. In FIG. 8, a black circle shows the trapped electric charge (electron in the embodiment, and hereinafter referred to as "electron") of the memory cell in each process. In the first embodiment according to the present invention, the non-use bit area of the trap layer is brought into the written state (state where the electron is trapped) when the erasing operation is completed. In this figure, the right-hand side of the trap layer is allocated to the use bit area, and the left-hand side to the non-use bit area.

At the time when automatic erasing operation is started up (S10), the non-use bit area on the left-hand side of the trap layer is in the written state, where the electron is trapped, and in the use bit area on the right-hand side of the trap layer, the electron is trapped if writing is performed, or the electron is not trapped if writing is not performed. Therefore, in a pre-erase writing process S11, the electron is trapped in the use bit area of the trap layer. Operation in this pre-erase writing process is the same as the writing operation shown in FIG. 2, and the pre-erase writing operation is individually effected on each memory cell. As a result of this operation, electrons are injected into both sides of the trap layer as shown by process S11 in the figure.

From this state, the holes are injected only into the use bit area on the right-hand side through an erase process, such that the use bit area enters to the erase state (S12). This erase process S12 is effected on a plurality of memory cells within the sector by single operation. The erase process S12 includes at least erase verification and erase pulse application. After the erase process, a write verifying is performed for checking whether the non-use bit area is in the written state or not, and if written is insufficient, the writing process is effected on the non-use bit area (S13). When the erasing operation is commenced, since the non-use bit area on the left-hand side of the trap layer is in the written state, in the writing operation in this process S13, the write processing is scarcely performed due to verification pass.

Figure 9:
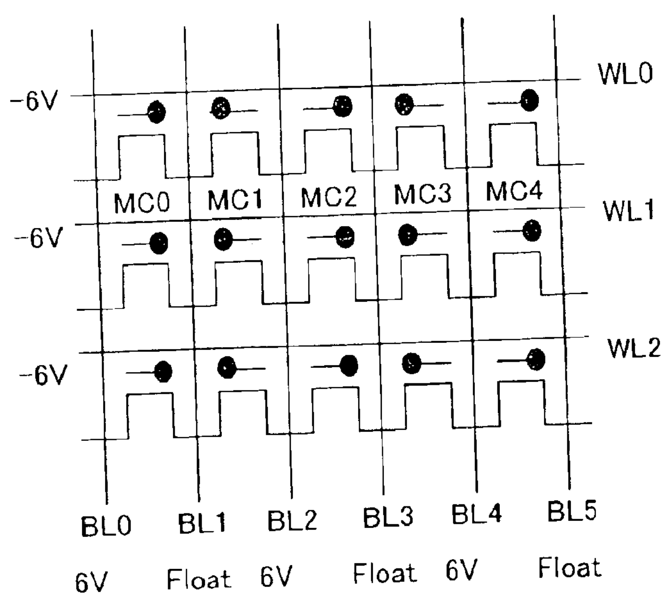
FIG. 9 is a diagram showing an example of an application voltage of a cell array when only the use bit area is erased.

FIG. 9 is a diagram showing an example of applied voltage of the cell array when only the use bit area is erased. The cell array shown in FIG. 9 comprises word lines WL0–WL2, bit lines BL0–BL5, and a memory cell MC disposed on the crossing point of these lines, respectively. Each of the bit lines is connected to a data latch circuit (not shown in the figure) In the memory cell shown in FIG. 9, both source/drains are connected to the bit lines, respectively. Accordingly, in the memory cells MC disposed side by side on the left and right sides, the use bit areas are reversed. In other words, in the memory cells MC0, MC2 and MC4, the left-hand side of the trap layer is the use bit area, and in the memory cells MC1 and MC3, the right-hand side of the trap layer is the use bit area. In short, the memory cell shown in FIG. 8 corresponds to the memory cells MC1 and MC3 shown in FIG. 9.

At the time when the pre-erase writing process S11 shown in FIG. 8 is completed, both sides of the trap layer of all memory cells are in the written state with the electron trapped. In that state, the erase process (S12) is performed only to the use bit area. Because of this operation, to the word line WL, for example, –6V, and to the even numbered bit lines BL0, BL2 and BL4, for example, 6V are applied, respectively. The odd numbered bit lines BL1, BL3, and BL5 are brought in, for example, floating state. As a result, for the memory cells MC0, MC2 and MC4, the left-hand side of the trap layer becomes the erase state, and for the memory cells MC1 and MC3, the right-hand side of the trap layer becomes the erase state. As a result, at the time when the automatic erase operation ends, the non-use bit area is in the written state, and the use bit area becomes the erase state. As shown in FIG. 9, in the erase process S12, an erase pulse is applied to a plurality of memory cells by a single operation.

Figure 2:
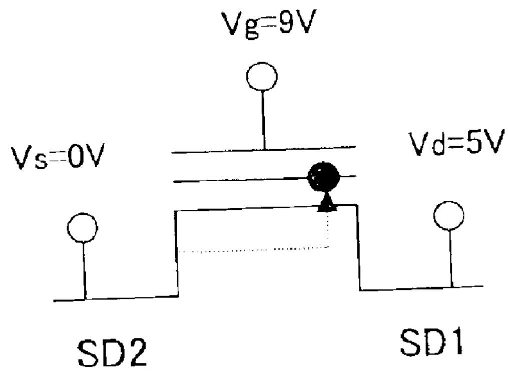
FIG. 2 is a diagram showing operations of a nonvolatile memory cell having a trap layer.
Figure 2:
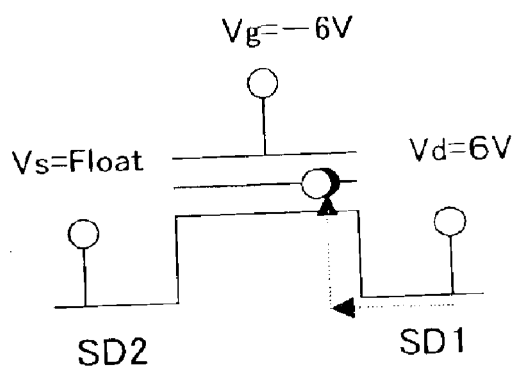
Figure 2:
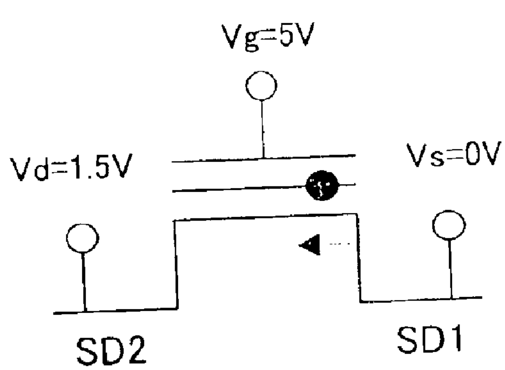
Figure 3:
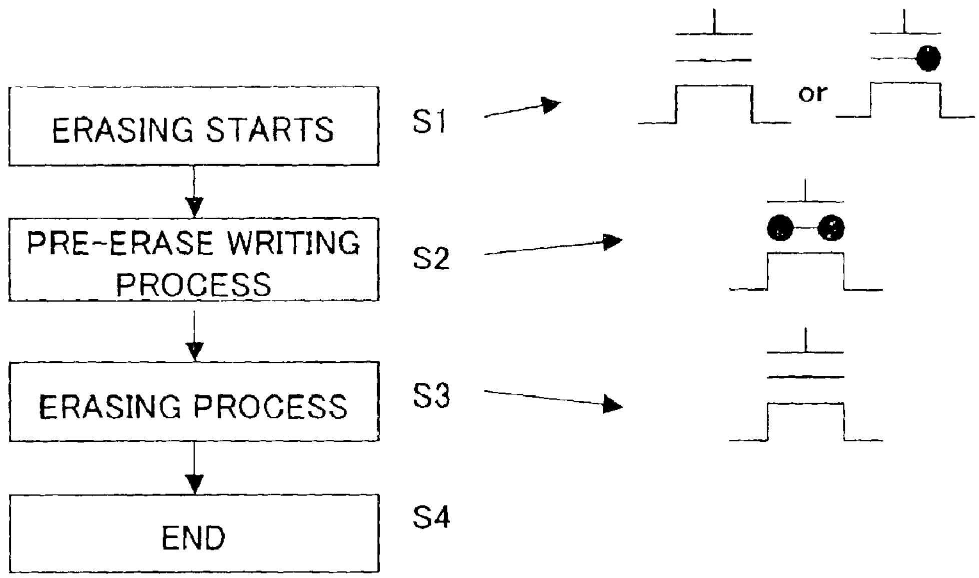
FIG. 3 is a flow chart of erasing operations of conventional memory.
Figure 4:
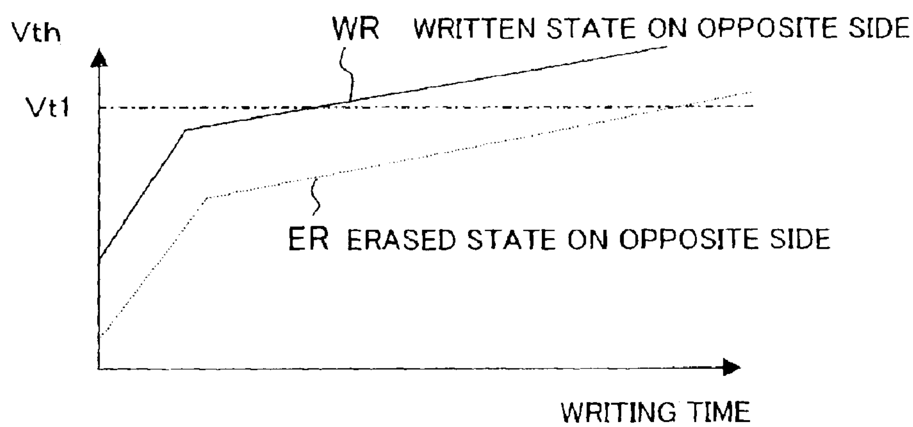
FIG. 4 is a diagram showing the relation between a writing time and threshold voltage Vth.
Figure 5:
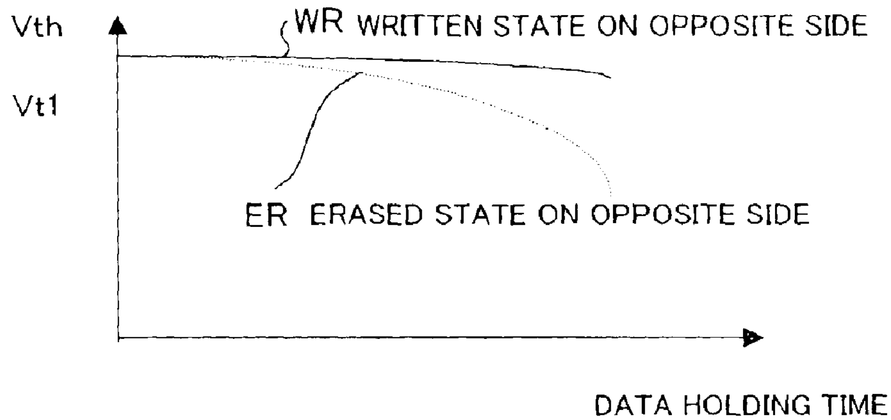
FIG. 5 is a diagram showing the relation between a data holding time and threshold voltage Vth.

After the automatic erasing operation ended, the electron is trapped in the use bit area depending on the stored data, such that the use bit area becomes the written state (data 0). This writing operation is as shown in FIG. 2. Since the electron is trapped in the non-use bit area of the trap layer so that the non-use bit area is in the written state, the writing time can be shortened as shown in FIG. 4. In addition, even in the data holding state after writing, since the non-use bit area of the trap layer is in the written state, dropping of the threshold voltage can be restrained even if the data holding time lasts longer, as shown in FIG. 5.

The reading operation is as shown in FIG. 2, and reading out of the data is performed depending on whether the cell transistor passes the current to the use bit area or not.

Figure 10:
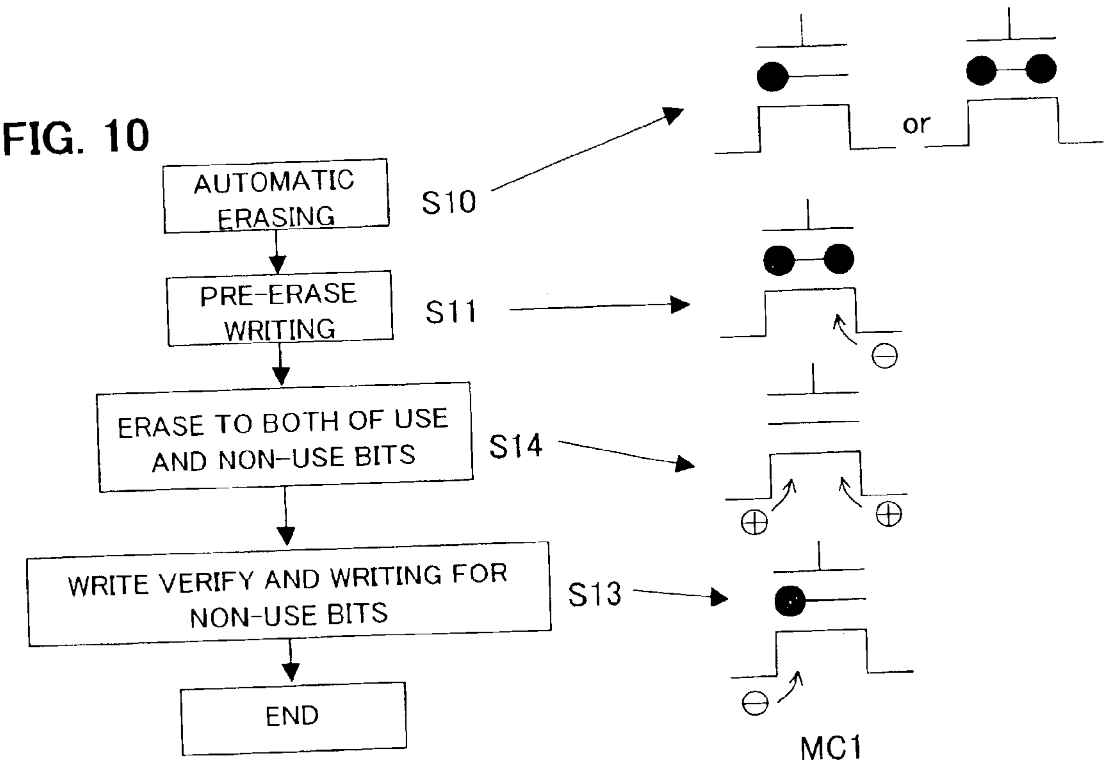
FIG. 10 is a flow chart of another automatic erasing operation in the first embodiment.

FIG. 10 is a flow chart of another automatic erasing operation in a first embodiment according to the present invention. In this erasing operation, the pre-erase writing process S11, and the verifying and writing process S13 of the non-use bit area are the same as in the automatic erasing operation shown in FIG. 8, however, both of the use bit area and the non-use bit area are erased, after the pre-erase writing process S11 (S14). As shown in FIG. 10, when the pre-erase writing process S11 is performed, electrons are trapped on the both sides of the trap layer of the memory cell such that both areas are brought into the written state. Here, when –6V is applied to the control gate, and 6V to both source/drain areas, respectively, the hot holes, which are injected into a channel area through tunnel, is injected to both sides of the trap layer. As a result of this injection, both of the use bit area and the non-use bit area of the trap layer are brought into the erased state. This erasing process S14 is also effected on a plurality of memory cells within the sector, and an erasing pulse is applied to the plurality of memory cells by a single operation.

Under the condition where electrons are trapped on both sides of the trap layer, like the process S14, if the erasing process is effected on both sides at the same time, erasing can be performed faster, compared to the erasing process effected only on one side. That is because, in the condition where electrons are trapped on both sides of the trap layer, electrons are also trapped in the central section of the trap layer due to the distribution of the trapped electrons, and thus, by injecting of the hot holes into both sides, not to one side only, the hot holes can be injected to the trap layer entirely, and erasing can be finished by a fewer erasing pulses. By the injection of the hot holes into only one side, the trap layer hardly enters to the erased state, due to the electrons trapped in the central section of the trap layer.

Figure 11:
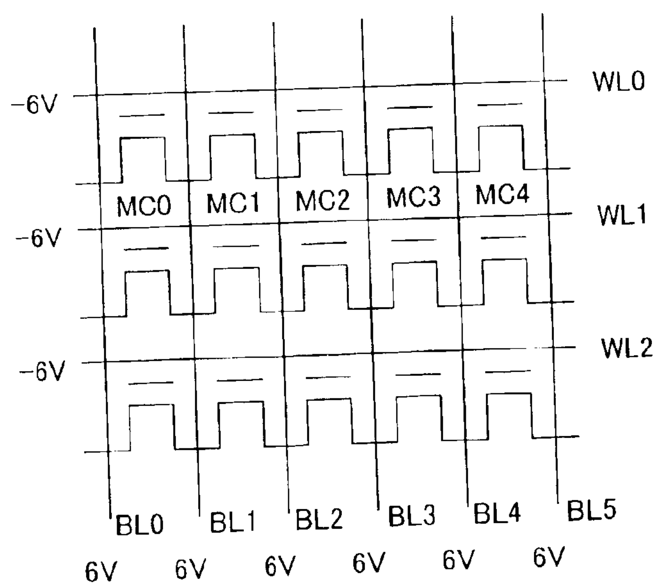
FIG. 11 is a diagram showing an example of an application voltage of a cell array when both of the use bit area and the non-use bit area are erased.

FIG. 11 is a diagram showing an example of application voltage of a cell array when both of the use bit area and the non-use bit area are to be erased. As described above, –6V is applied to the word line WL, and 6V is applied to all bit lines.

In the process S13 shown in FIG. 10, the write verifying and writing process is effected on the non-use bit area, and an electron is trapped in the non-use bit area on the left-hand side of the trap layer, such that the area enters to the written state. The use bit area on the right-hand side of the trap layer still remains in the erased state.

As described above, in the automatic erasing operation, both bit areas may be brought into the erased state, after the pre-erase writing process. However, in that case, the writing time in the writing process S13 to the non-use bit area becomes longer than the case shown in FIG. 8. However, it can be avoided to lower the performance of flash memory as a whole, by performing of writing to the non-use bit area during a series of the automatic erasing operation, since the automatic erasing operation itself requires a longer time.

At the time when a series of the erasing operations shown in FIGS. 10 and 11 are completed, as the non-use bit area of the trap layer is in the written state, the writing time thereafter to the use bit area can be shortened, and further dropping of the threshold voltage can be restrained even if the data holding time becomes long.

In the erasing operation shown in FIG. 10, writing is performed finally to the non-use bit area for trapping an electron. However, in the erasing operation, this writing processing to the non-use bit area may be omitted, and thereafter, during the writing operation to the use bit, writing to the non-use bit of the memory cell may be performed at the same time. In short, the improvement of the retention characteristic of data is for the state where the electron is trapped in the non-use bit area. Therefore, if the writing to the non-use bit area is performed only for the memory cell where data is to be written during the program process, the number of writing processes can be reduced as a whole. In short, as shown in FIG. 10, during the erasing operation, the writing processing is not required to effected on the non-use bit area of all memory cells.

If writing to the non-use bit area is completed until before writing to the use bit area, the holding characteristic of the written data can be improved as shown in FIG. 5. Furthermore, as long as writing into the non-use bit area is performed immediately before writing into the use bit area, the writing characteristic into the use bit area can be improved.

Figure 12:
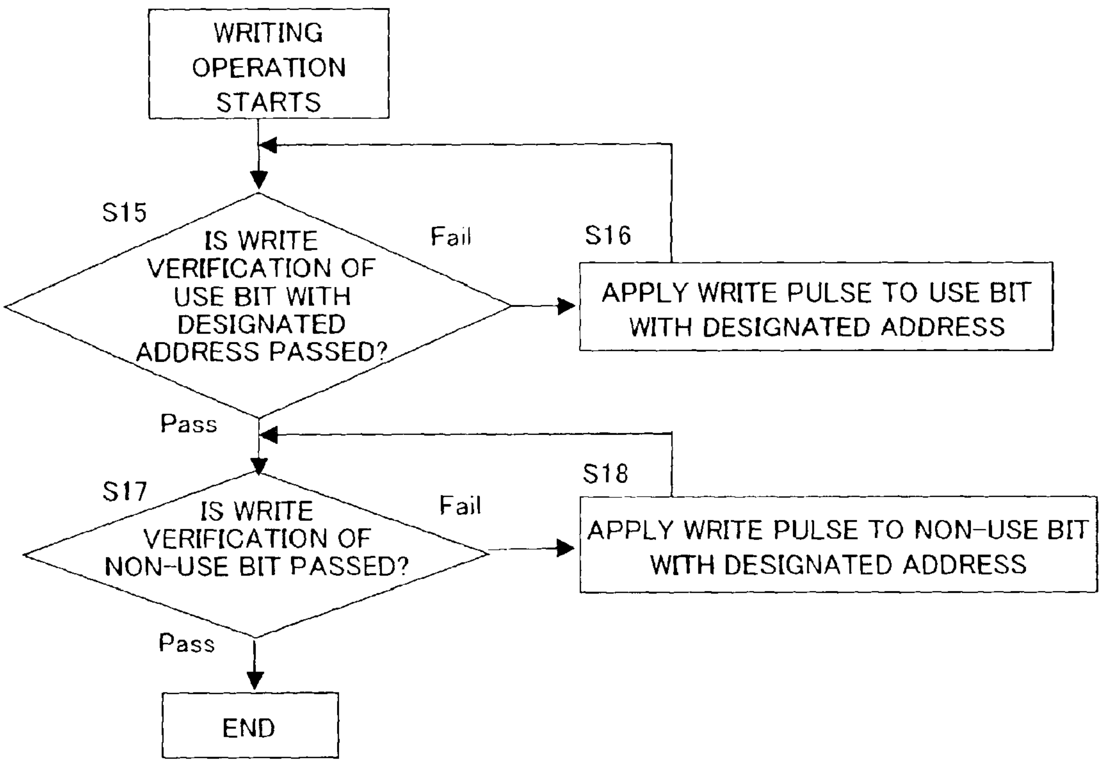
FIG. 12 is a flow chart of a modified example of writing operations in the first embodiment.
Figure 13:
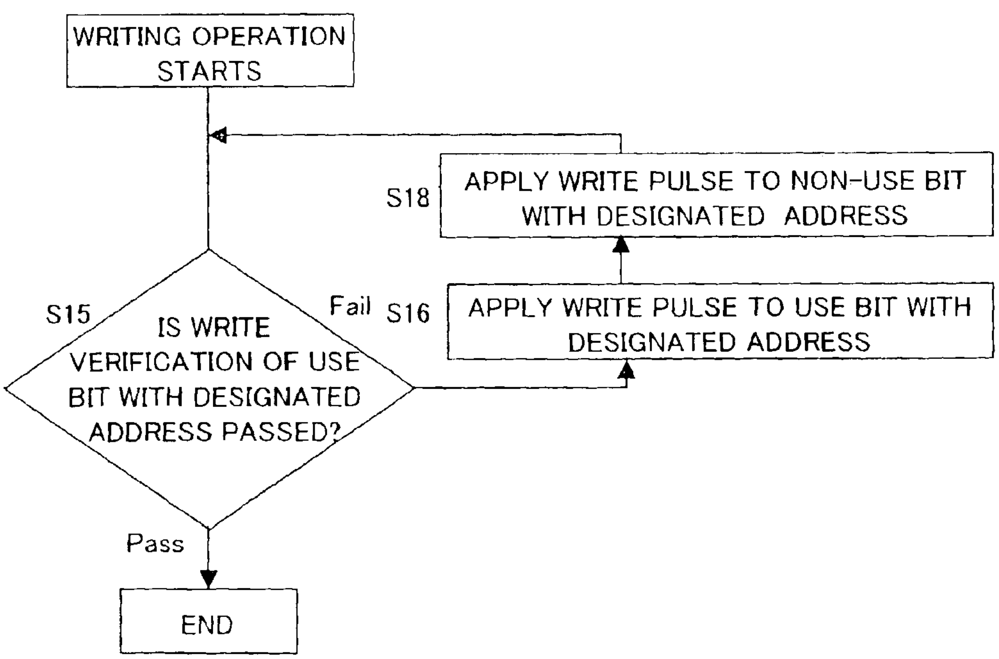
FIG. 13 is a flow chart of a modified example of writing operations in the first embodiment.
Figure 14:
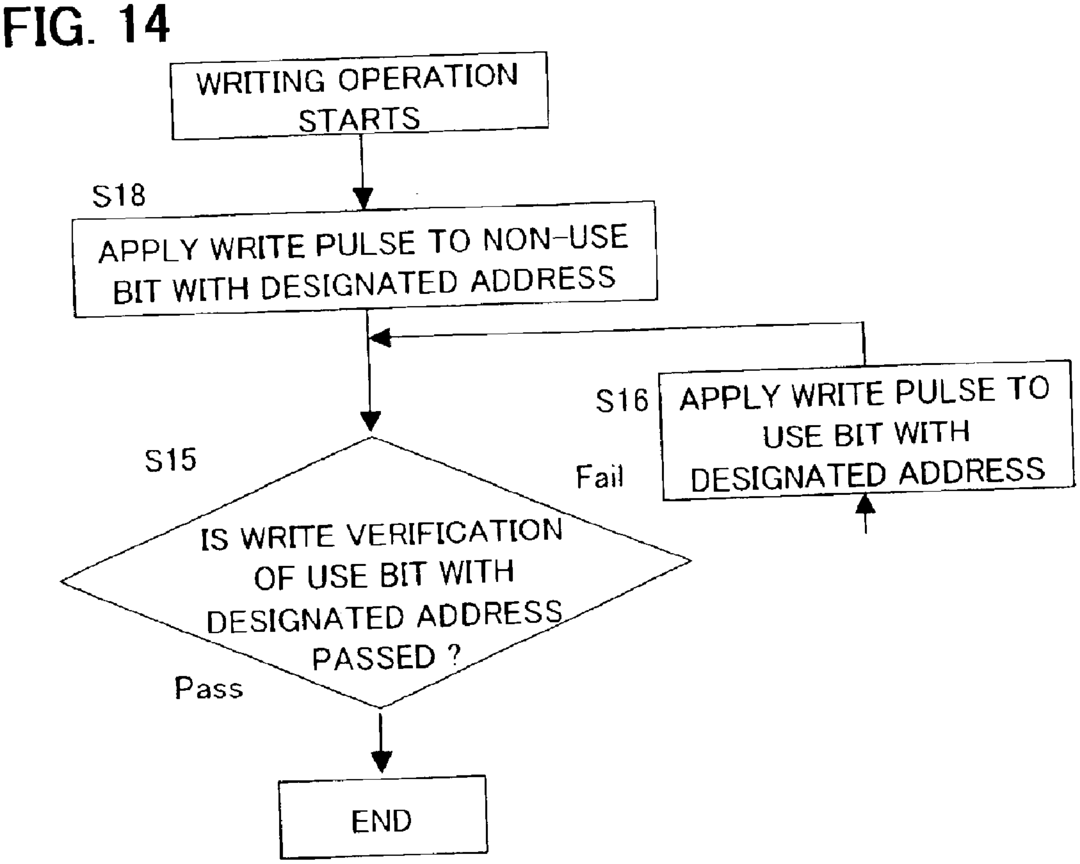
FIG. 14 is a flow chart of a modified example of writing operations in the first embodiment.

FIGS. 12, 13, and 14 are flow charts of writing operation in a modified example. Three types of writing operation (program operation) are described.

In an example shown in FIG. 12, writing is effected on the use bit area of the memory cell having a specified address, and then after that writing successfully passes the verification, writing to the non-use bit area is performed. In short, the writing pulse is repeatedly applied to the use bit area with a specified address (S16), until the write verification S15 of the specified address is passed. When the write verification is passed, the writing pulse is repeatedly applied to the non-use bit area of the memory cell with the same address S18, until that write verification S17 is passed.

In an example shown in FIG. 13, when writing to the use bit area of the memory cell with a specified address is performed, the wiring pulse is applied to the use bit area S16, and at the same time, the writing pulse is forcibly applied to the non-use bit area S18. Both writing pulse applications S16 and S18 are repeatedly performed, until write verification to the use bit area with the specified address is passed. However, the write verification to the non-use bit area is not performed. In writing operation for injecting an electron into the trap layer, a great amount of electrons is injected by the first application of the writing pulse. And, the amount of electrons to be injected is very small, by the following application of the writing pulse, compared to the amount in the case of the first pulse application. Even if the write verification to the non-use bit area that is not accompanied by data read-out is omitted, there is no harm. As long as some electrons are trapped in the non-use bit area, the data holding characteristic is improved.

In an example shown in FIG. 14, prior to the writing processing to the memory cell with a specified address, the writing pulse is applied to the non-use bit side only for a specified number of times (S18), and after that, writing process is effected on the use bit side having a specified address. In other words, the writing pulse is repeatedly applied to the use bit area S16, until the write verification is passed S15. In this example, in spite of the application of the writing pulse to the non-use bit area being performed only a specific number of times, the sufficient amount of electrons can be injected, as described above. Therefore, the reduction of the writing time after the injection, and the improvement of the data holding characteristic can be achieved.

(Second Embodiment (Example of Bringing the Non-use Bit into the Written State))

Figure 6:
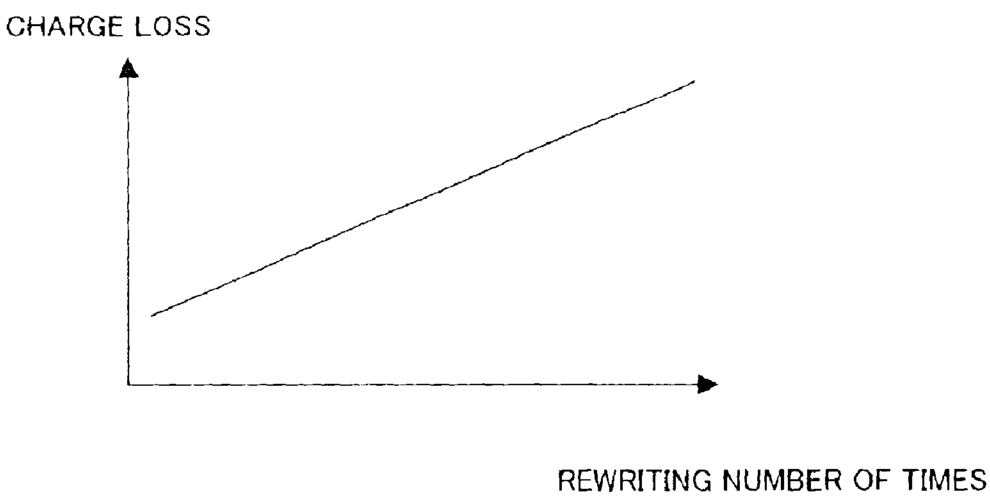
FIG. 6 is a diagram showing the relation between the rewriting number of times and the amount of charge loss.

As shown in FIG. 6, in flash memory, with the increase in the rewriting number of times, the disappearing amount of the charge (electric charge) trapped within the trap layer increases. One of the reasons believed to be true is the deterioration of the gate oxide film, caused by the stress resulting from the writing pulse or erasing pulse that is applied every rewriting operation.

Therefore, in a second embodiment, by taking the advantage of the possibility of using separately the trap areas on both sides of the trap layer which is of an insulating type, the use bit area and the non-use bit area of the trap layer are replaced or switched, every rewriting operation of a specified number of times. As a result, since the rewriting processing is scattered in two areas of the trap layer, the rewriting number of times can be reduced by half as to each of the areas, and the increase in the amount of charge loss can be restrained.

Figure 15:
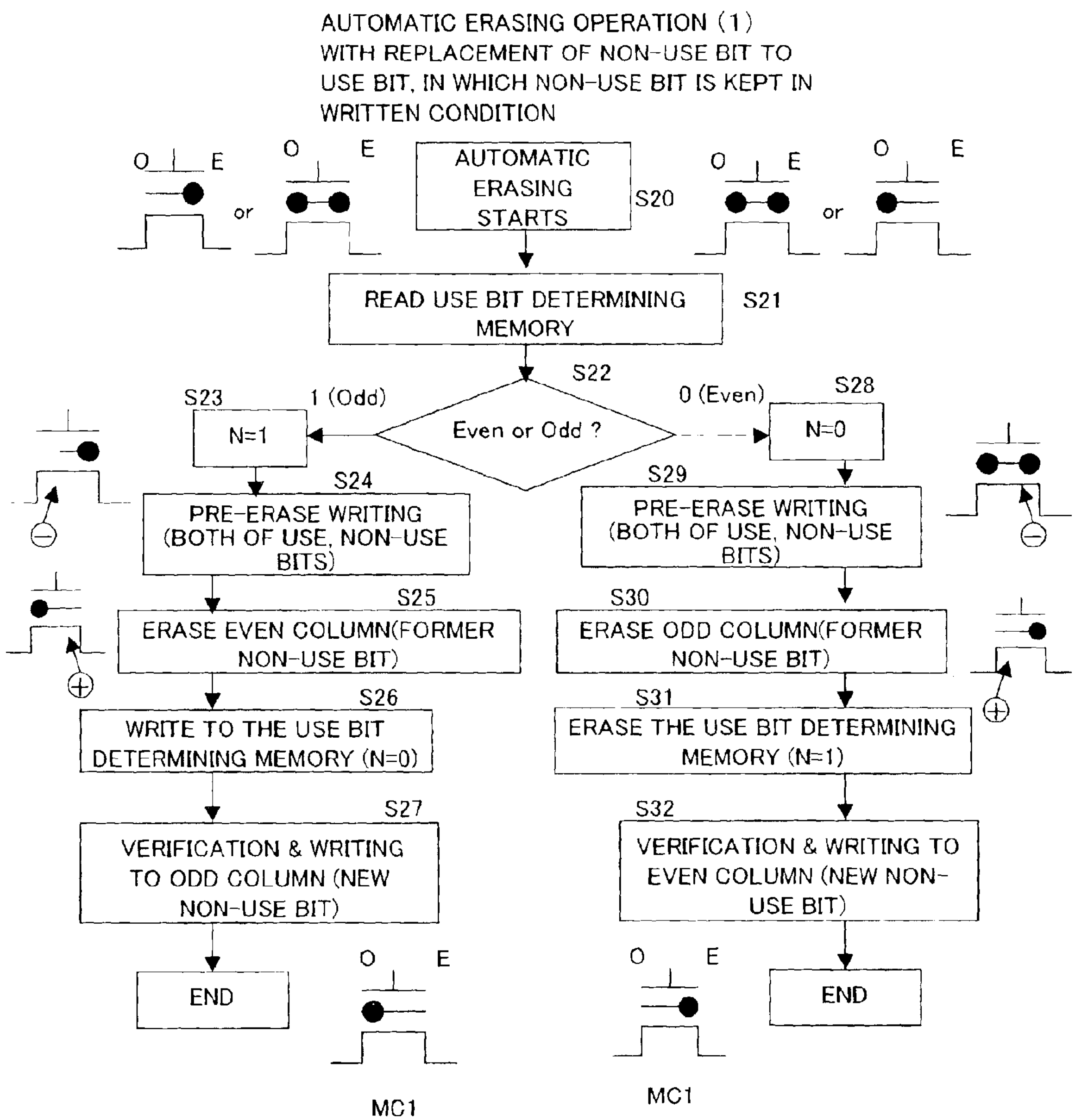
FIG. 15 is a flow chart of erasing operations in a second embodiment.

FIG. 15 is a flow chart of erasing operations in the second embodiment. For making the following description understandable, the left-hand side of the trap layer is an odd bit area (O), and the right-hand side an even bit area (E). The left-hand side of the flow chart shown in FIG. 15 shows an example where the use bit area, which was an odd area, is replaced with an even area, and the right-hand side shows a reversed example of that shown on the left-hand side.

First of all, at the point S20 when the automatic erasing starts, in the memory cell of the left-hand side the odd side (O) is the use bit area, and is in the state where electrons are trapped, or not trapped, depending on the presence or absence of writing. In the memory cell of the right-hand side, the even side is the use bit area. First of all, the controller reads out use bit determining memory (S21), and detects which bit area is the use bit area (S22). If the odd side (O) is the use bit, the output of judging memory is N=1 (S23), and in pre-erase writing, writing is effected on the odd side (O) (D24). However, if writing is already performed before starting of automatic erasing operation, in this pre-erase writing, write verification is passed without applying the write pulse. The pre-erase writing as described above is individually effected on memory cells.

Then, an erasing process is effected on the former non-use bit area on the even side (S25). By this operation, the even side (E) is brought into the state where electrons are not trapped, while the odd side (O) remains in the state where electrons are trapped. With the replacement of the use bit, writing processing is effected on use bit determining memory, and the data is reversed to N=0 (S26). Finally, the write verification and writing processing is effected on the odd side (O), which newly becomes the non-use bit area (S27). In this example, since the odd side (O) is already in the written state, the write verification is passed without applying the writing pulse. As a result, in the memory cell, electrons are trapped on the odd side (O), and the even side (E) is in the erased state.

Figure 16:
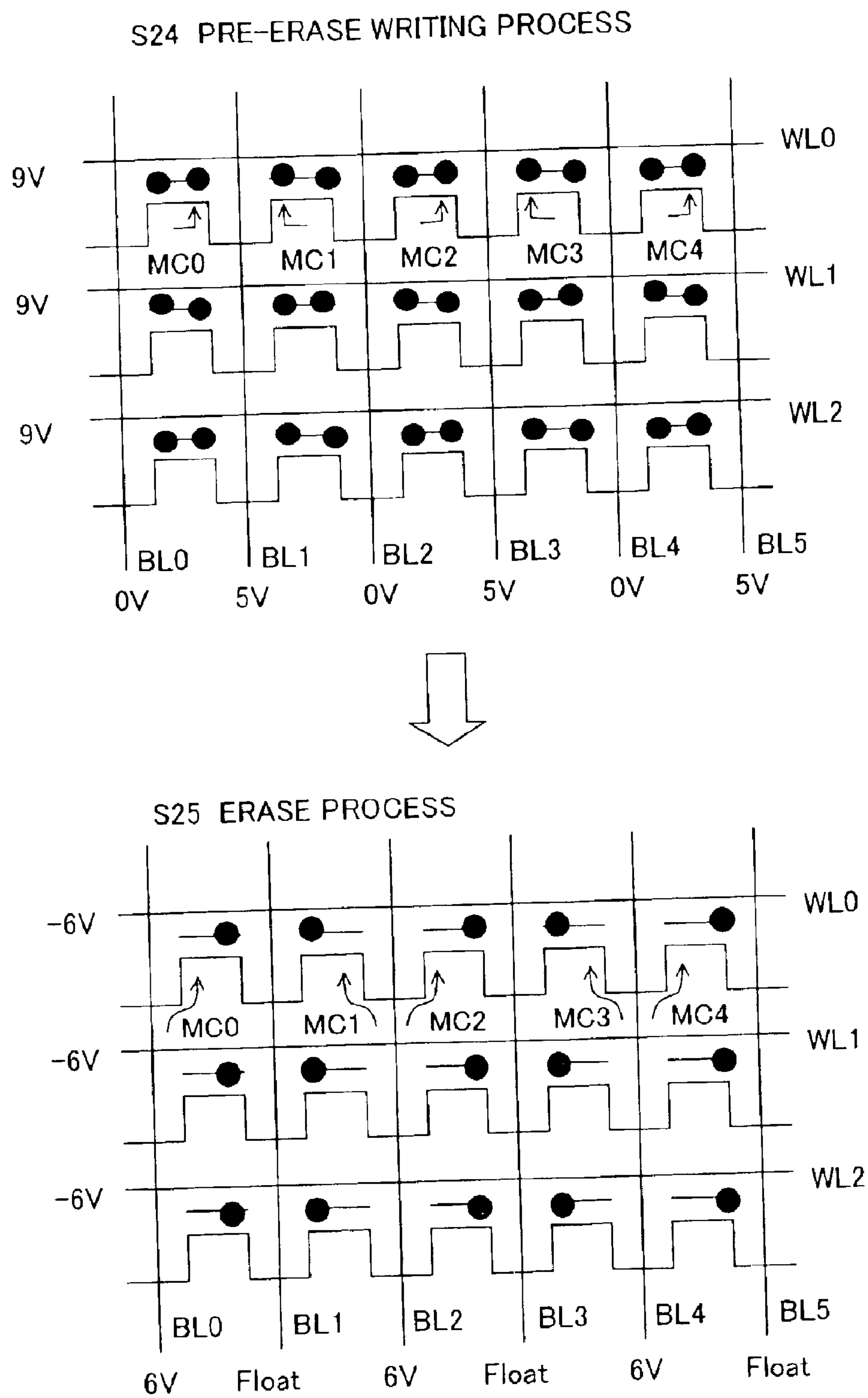
FIG. 16 is a diagram showing an example of a control voltage in a pre-erase writing process S24, and an erasing process S25.

FIG. 16 is a diagram showing an example of control voltages in the pre-erase writing process S24, and the erasing process S25. In the pre-erase writing process S24, 5V is applied to the odd numbered bit lines, and 0V is applied to the even numbered bit lines, such that electrons are injected into an area on an odd numbered column side of each memory cell. This pre-erase writing process is effected on every memory cell one by one sequentially. However, the pre-erase writing process may be effected on all memory cells simultaneously. Next, in the erasing process, the odd numbered bit lines are brought into the floating state, and 6V is applied to the even numbered bit lines, such that the holes are injected into an area on the even numbered column side of each memory cell. The memory cell shown in FIG. 15 corresponds to the memory cell MC1 shown in FIG. 16. As described above, in the erasing process S25, the erasing pulse is applied to a plurality of memory cells by a single operation or simultaneously.

Reference is returning back to FIG. 15. On the other hand, when use bit determining memory is read out, if the read out data was N=0 so that the use bit area was on an even number side (E) (S28), in the pre-erase writing processing, writing is effected on the even number side in the use bit area (S29), and the erasing process is effected on an odd number side (O) (S30) With these operations, use bit determining memory is erased, and data is changed to N=1 (S31). Finally, the write verification and writing process is effected on the even number side (E) that newly becomes the non-use bit area (S32). As a result of this operation, in the memory cell, electrons are trapped on the even number side (E), and the odd number side. (O) enters the erased state.

Figure 17:
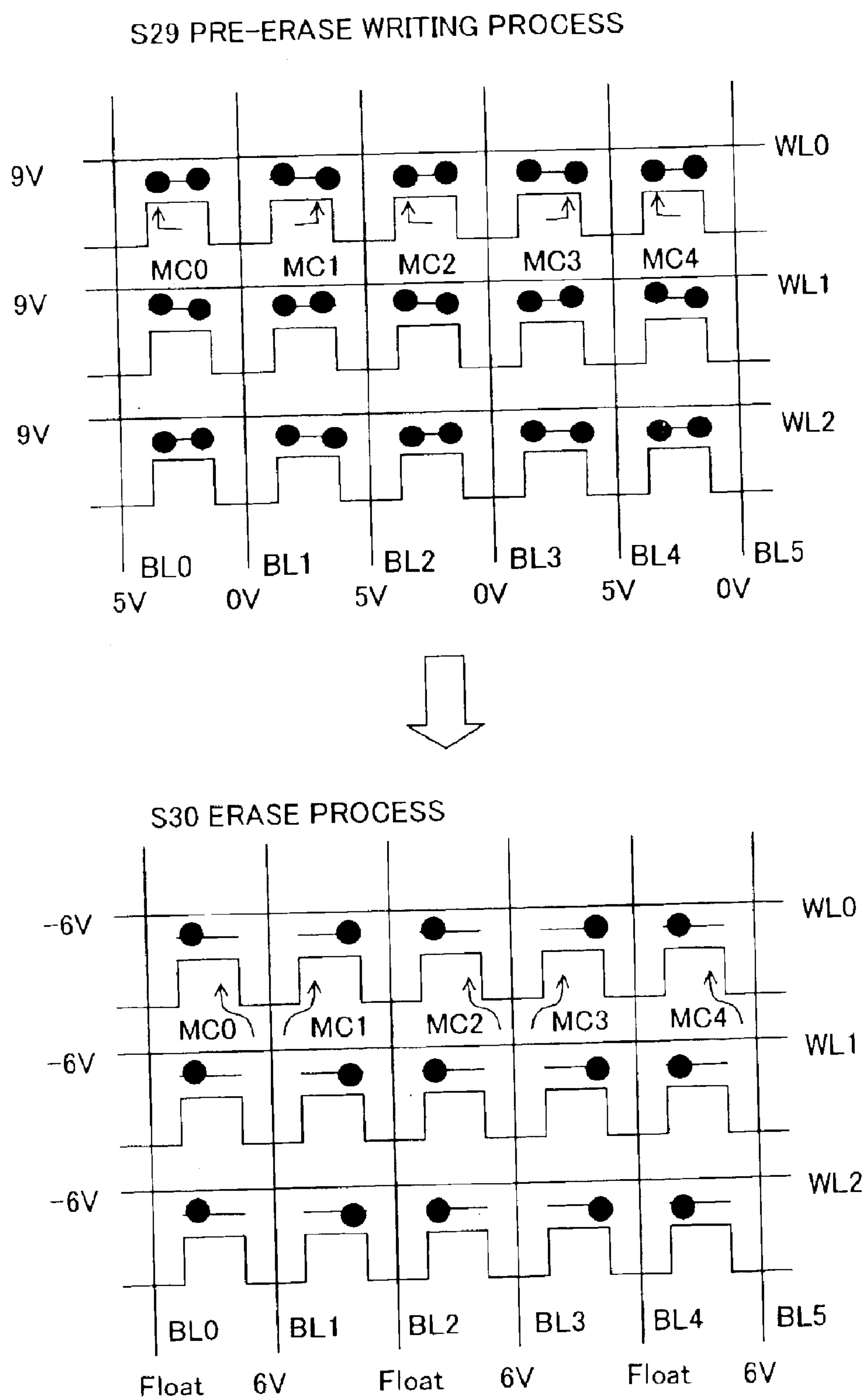
FIG. 17 is a diagram showing an example of a control voltage in a pre-erase writing process S29, and an erasing process S30.

FIG. 17 is a diagram showing an example of control voltages in the above-described pre-erase writing process S29, and the erasing process S30. In the pre-erase writing process S29, 0V is applied to the odd numbered bit lines, and 5V is applied to the even numbered bit lines, respectively, and electrons are injected to the side of the even numbered bit lines of each memory cell. Also, in the erasing process S30, the even numbered bit lines are forced to enter the floating state, and 6V is applied to the odd numbered bit lines, such that the holes are injected into the side of the odd numbered bit lines of the memory cell. Also in this case, in the erasing process S30, the erasing pulse is simultaneously applied to the plurality of memory cells.

According to the automatic erasing process shown in FIG. 15, the use bit area and the non-use bit area are switched every single rewriting operation. For N times of rewriting, each bit area undergoes the writing process and the erasing process N/2 times, and thus the increase in the amount of charge loss can be restrained.

Figure 18:
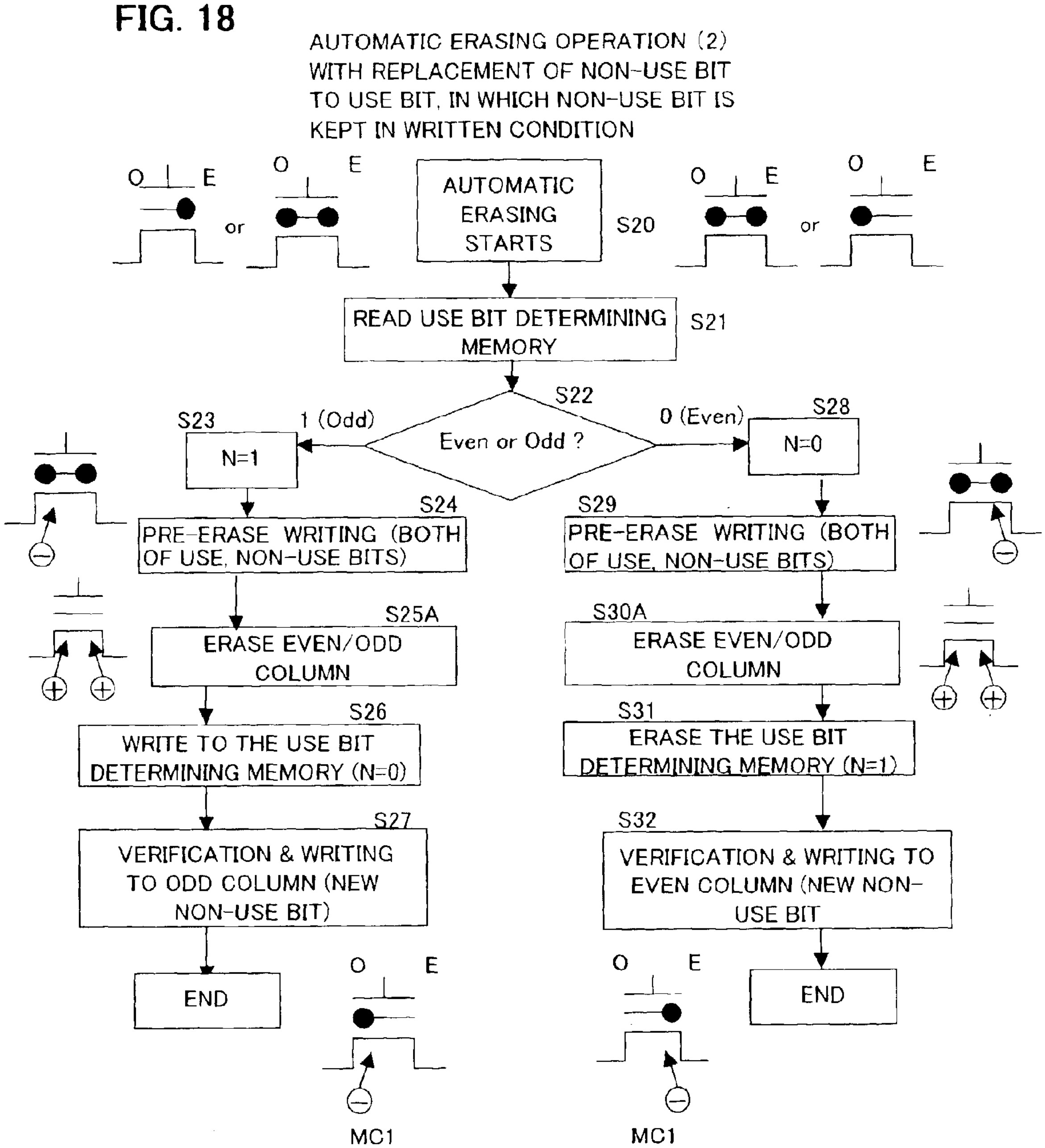
FIG. 18 is a flow chart of another automatic erasing operations in the second embodiment.

FIG. 18 is a flow chart of another automatic erasing operations in the second embodiment. The same reference numerals are given to the same process as shown in FIG. 15. In an example shown in FIG. 18, in erasing processes S25A and S30A, the holes are injected into both of the odd number side and even number side, such that both sides are forced to enter the erased state. Then, finally writing is effected on the new non-use bit area, for trapping electrons (S27, S32).

In the example shown in FIG. 18, during the erasing processes S25A and S30A, as shown in FIG. 11, 6V is applied to all bit lines, and the holes are injected into the bit areas on both sides of the memory cell. Therefore, the erasing process can be performed in a shorter period of time compared to the case when the holes are injected only into the area on one side. In short, this example exhibits the effect of restraining the increase in the amount of charge loss, due to the shortened time for applying the erasing pulse.

Figure 19:
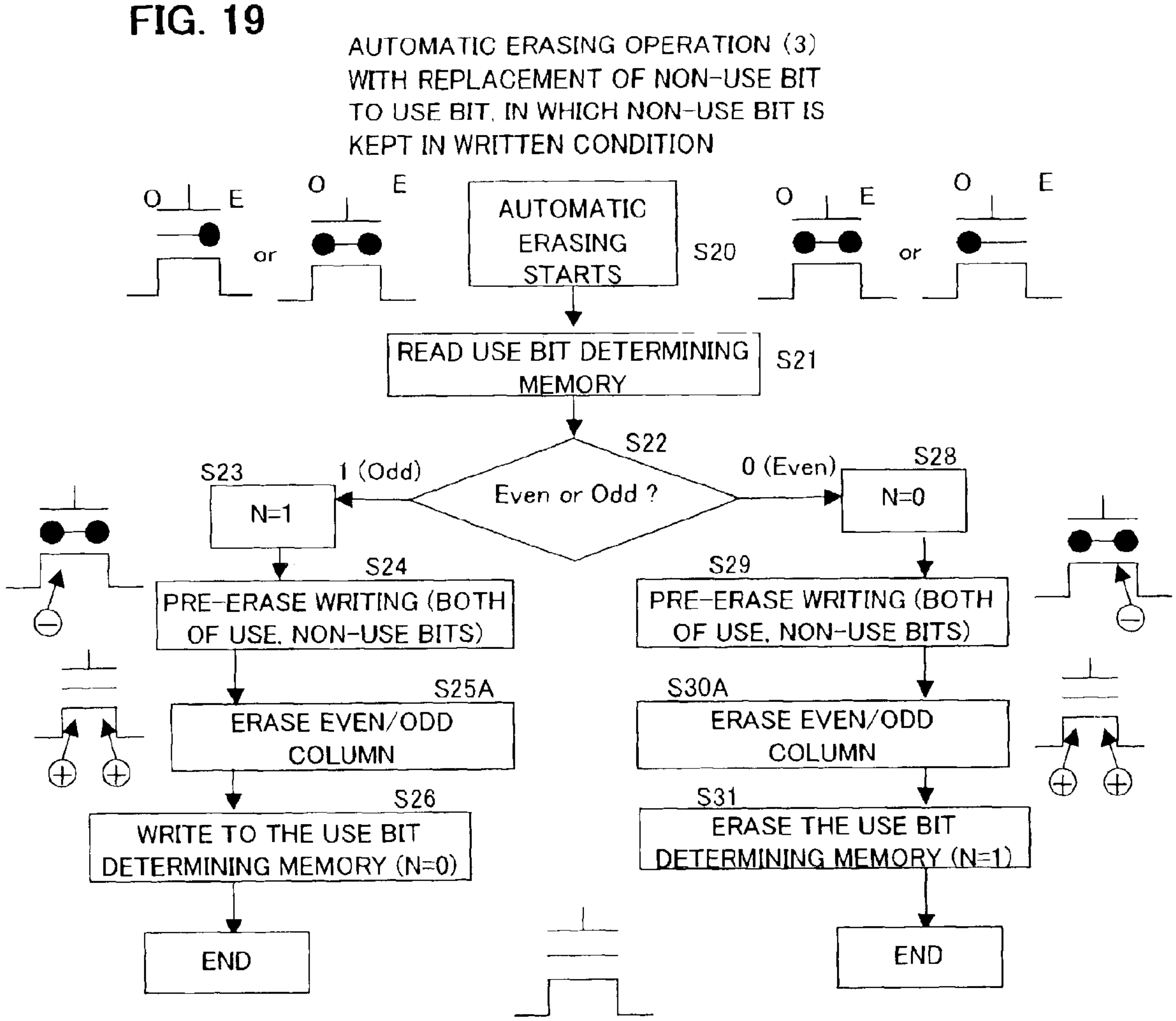
FIG. 19 is a flow chart of a modified example of automatic erasing operations in the second embodiment.

FIG. 19 is a flow chart of a modified example of the automatic erasing operations in the second embodiment. In a series of the automatic erasing operations shown in FIG. 18, in the erasing process, the bit areas on both sides are brought into the erased state, and at the last of a series of the erasing operations, an electric charge is injected to the side of the non-use bit area. However, as shown in FIGS. 12, 13, and 14, instead of executing of the writing process to the non-use bit area in the automatic erasing operations, writing may be effected on the non-use bit area of the memory cell when writing is effected on the use bit area. FIG. 19 is a flow chart of such an automatic processing operations. When this figure is compared to FIG. 18, the verification and writing processes S27 and S32 to the new non-use bit area at the last stage of a series of the operations are omitted. In this case, in the writing operations shown in FIGS. 12, 13, and 14, before writing is performed, use bit determining is read out for checking which side is the use bit area. Also in this case, in the data holding state, as the electric charge is trapped in the non-use bit area, the data holding characteristic can be improved.

Figure 20:
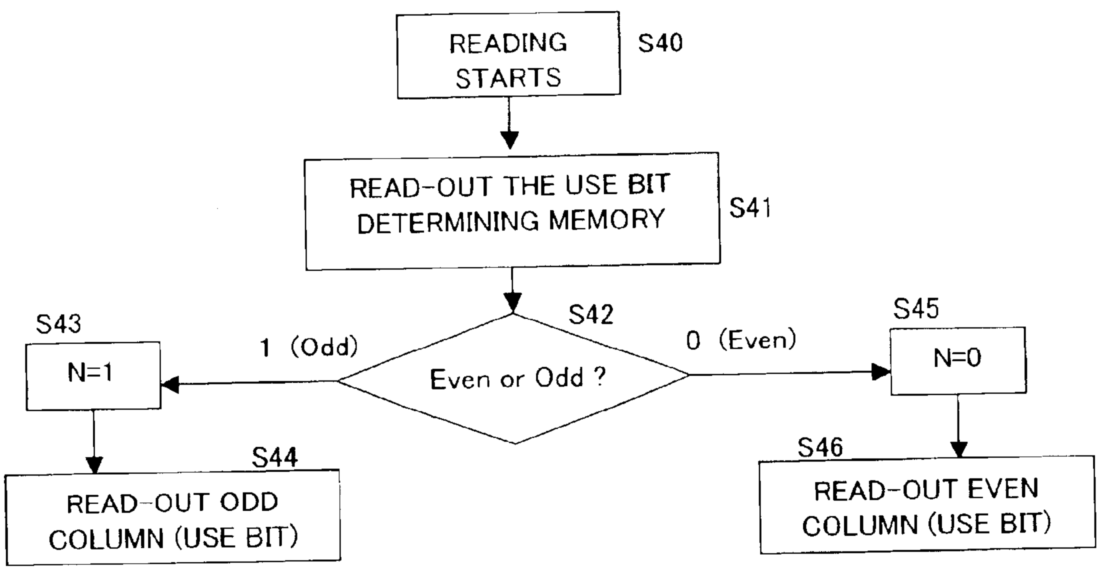
FIG. 20 is a flow chart of read-out operations in the second embodiment.

FIG. 20 is a flowchart of read-out operations in the second embodiment. In the read-out operation, first of all, use bit determining memory is read out (S41), for checking which area is the use bit area (S42). If the read-out data is N=1, since the odd number side (O) is the use bit area, the bit on the odd number side is read out (S44). Or, if the read-out data is N=0, since the even number side (E) is the use bit area, the bit on the even number side is read out (S46).

Although not shown in the figure, in the second embodiment, like the read-out operation, in the writing operation, first of all, use bit determining memory is read out for checking which area should be written, and an electric charge is injected into the use bit area.

(Second Embodiment (Example of Bringing the Non-use Bit Area to the Erased State))

In the above-described second embodiment, the non-use bit area is brought into the written state with the electric charge trapped, and further, the use bit area and the non-use bit area are switched every rewriting operation. However, in the case of exchanging the use bit area and the non-use bit area, even if the non-use bit area is kept in the erased state during storing data, the increase in the amount of charge loss can similarly be restrained. In short, it is not necessarily required to bring the non-use bit area to the written state, like the first embodiment.

Figure 21:
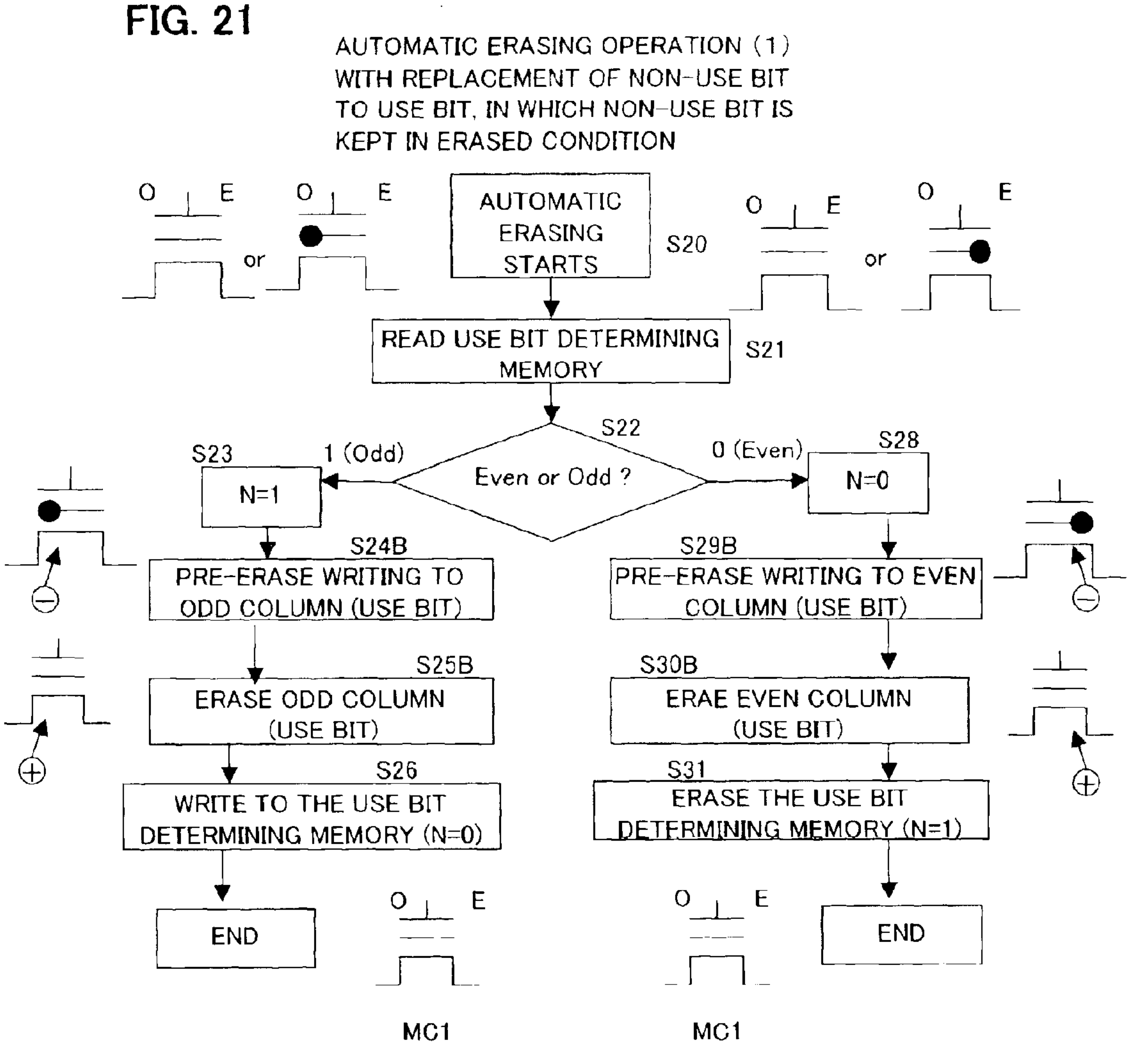
FIG. 21 is a flow chart of automatic erasing operations when the non-use bit is brought into the erased state for changing the use bit.

FIG. 21 is a flow chart of automatic erasing operations in the case where the non-use bit is kept in the erased state, and the use bit is switched. In this example, erasing operation is performed only to the use bit area. In the figure, the same process No. is given to the process corresponding to the process shown in the flow chart in FIG. 15 in which the non-use bit is kept in the writing state. At the time when automatic erasing starts S20, in the memory cell, the non-use bit area is in the erased state, and the use bit area is in the erased state or writing state.

First of all, use bit determining memory is readout (S21), for checking whether the use bit area is on the odd number side or the even number side. If the use bit area is on the odd number side, in the pre-erase writing process S24B, an electron is injected to the odd number side (O), that is the use bit side, so as to perform writing. If the odd number side is already in the writing state, the pre-erase writing operation to be performed here passed the first verification, and the writing pulse is not applied. This pre-erase writing process S24B differs from the process S24 shown in FIG. 15. In addition, in the erasing process S25B, the holes are injected into the odd number side of the use bit side of all memory cells, so that the odd number side becomes the erased state. This process also differs from the erasing process S25 shown in FIG. 15. After the injection, writing processing S24 is effected on use bit determining memory, and the use bit is changed to the even number side.

On the other hand, if the use bit is on the even number side, in a pre-erase writing process S29B, an electron is injected to the even number side (E), that is the use bit side, and further in an erasing process S30B, the holes are injected into the even number side (E) of all memory cells, that is the use bit side, such that the even number side becomes the erased state. After that, an erasing processing S31 is effected on use bit determining memory, and the use bit is changed to the odd number side.

After the above-described erasing operations, writing processing is effected on the use bit side of a specified memory cell. Therefore, in this example, for N times of rewriting, each bit area undergoes only N/2 times of rewriting (writing process and erasing process), and thus the increase in the amount of charge loss resulting from the increase in rewriting number of times can be restrained.

Figure 22:
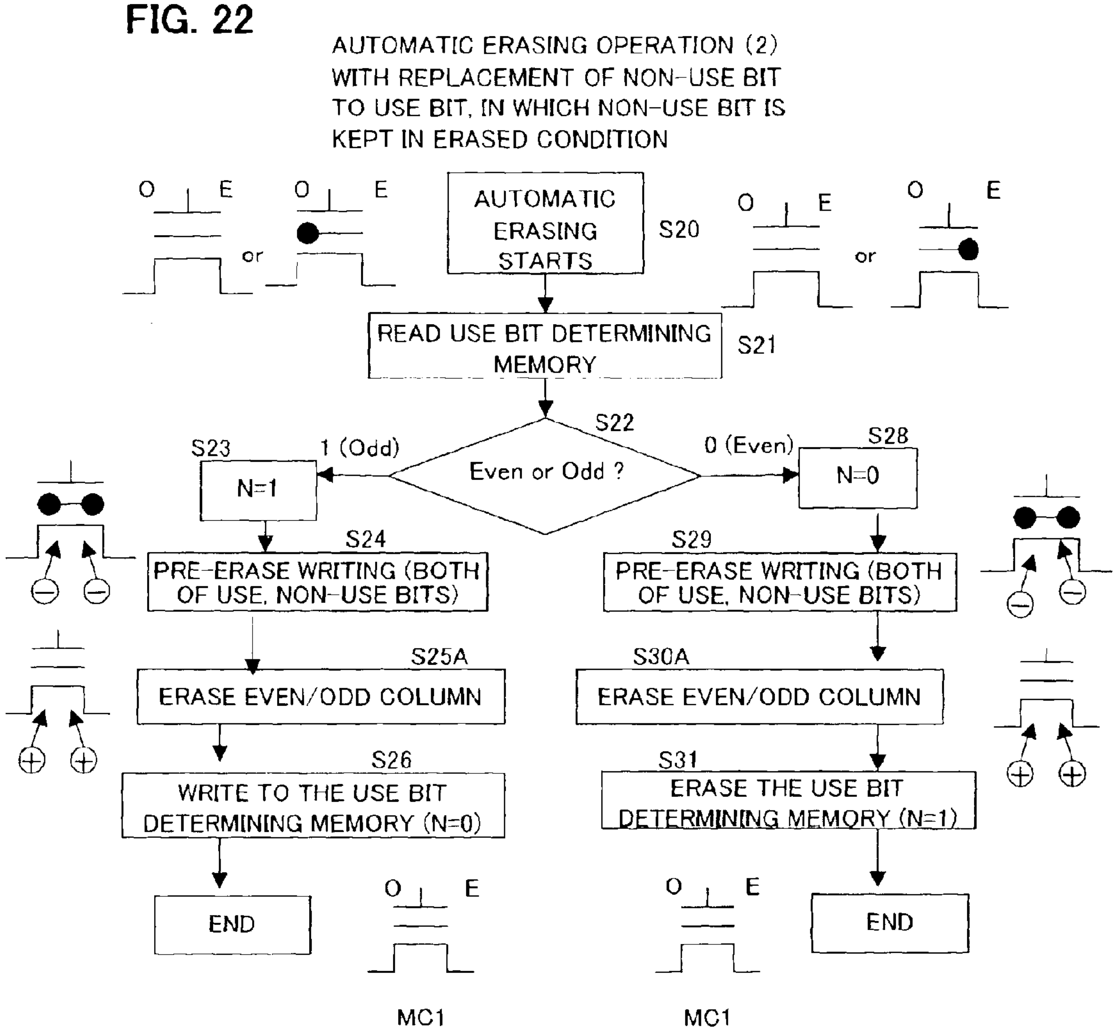
FIG. 22 is another flow chart of automatic erasing operations when the non-use bit is brought into the erased state for changing the use bit.

FIG. 22 is a flow chart of another automatic erasing operations in which the non-use bit area is kept in the erased state and the use bit is switched. In this example, erasing is effected on both of the use bit area and the non-use bit area. In this figure, the same process No. is given to the process corresponding to the process shown in the flow chart in FIG. 18 in which the non-use bit is kept in the writing state. Also in this case, at the time when automatic erasing starts S20, in the memory cell, the non-use bit area is in the erased state, and the use bit area is in the erased state or the writing state.

First of all, use bit determining memory is read out for detecting the use bit area (S21 and S22). In the pre-erase writing operation, regardless of whether the use bit is on the odd number side or even number side, writing is effected on both sides and an electron is injected (S24 and S29). Then, the holes are injected and erasing is effected on both sides in all memory cells (S25A and S30A). If the use bit is on the odd number side, writing is effected on use bit determining memory, such that the data becomes N=0 (S26). On the other hand, if the use bit is on the even number side, erasing is effected on use bit determining memory, such that the data becomes N=1 (S31).

In this example since the holes are injected to both sides of the trap area in the erasing processes S25A and S30A, erasing process can be finished in a short period of time, and the accompanying stress applying number of times can be reduced.

Although in the above embodiment, the use bit area and the non-use bit area are switched at every erasing operation, the use bit area and the non-use bit area may be switched at every specified number of times of rewriting operations. As the above switching is performed during the erasing operation, the use bit determining memory is provided for each sector based on which erasing is effected, such that the position of the use bit is controlled on a sector-by-sector basis.

As set forth hereinabove, according to the present invention, the non-use bit area of the trap layer is brought into the state where the electric charge is trapped, and thus the data holding characteristics can be improved. In addition, if the non-use bit area is put in the electric charge trapped state before rewriting is performed, then the writing characteristics can be improved.

What is claimed is:

1. A nonvolatile memory comprising:

a plurality of memory cells, each of the memory cells having a first and a second source/drain areas, a control gate, and an insulating trap layer disposed between the control gate and a channel area lying between the first and the second source/drain areas, wherein the trap layer includes a use bit area in proximity to the first source/drain area, for storing data depending on the presence or absence of electric charge to be trapped, and a non-use bit area in proximity to the second source/drain area, in which the electric charge is trapped while data is held in the use bit area, and wherein at the time when an erasing operation mode for bringing the use bit area into an erased state is completed, or before a writing operation to the use bit area, the non-use bit area is put in the electric charge trapped state.

2. The nonvolatile memory according to claim 1, wherein in the erasing operation mode, both of the use bit area and the non-use bit area are put in the electric charge trapped state, and then, the use bit area of a plurality of memory cells is put in the erased state.

3. The nonvolatile memory according to claim 1, wherein in the erasing operation mode, both of the non-use bit area and the use bit area are put in the electric charge trapped state, and then, both the bit areas of a plurality of memory cells are put in the erased state, and further, the non-use bit area is put in the electric charge trapped state.

4. The nonvolatile memory according to claim 1, wherein in the erasing operation mode, both of the non-use bit area and the use bit area are put in the electric charge trapped state, and then, both the bit areas of a plurality of memory cells are put in the erased state, and wherein in the writing operation mode, the non-use bit area is put in the electric charge trapped state.

5. The nonvolatile memory according to claim 4, wherein in the writing operation mode, a writing pulse is applied to the non-use bit area, and the writing pulse is applied to the use bit area together with write verification for the use bit area.

6. The nonvolatile memory according to claim 4, wherein in the writing operation mode, the non-use bit area of the memory cell subject to writing is put in the electric charge trapped state whereas writing is not performed to the non-use bit area of the memory cell that is not subject to writing.

7. The nonvolatile memory according to claim 4, wherein in the writing operation mode, writing is performed to the use bit area after having put the non-use bit area in the electric charge trapped state.

8. A nonvolatile memory comprising:

a plurality of memory cells, each of the memory cells having a first and a second source/drain areas, a control gate, and an insulating trap layer disposed between the control gate and a channel area lying between the first and the second source/drain areas, wherein the trap layer includes a use bit area disposed in proximity to one of the first and the second source/drain areas, the use bit area storing data depending on the presence or absence of electric charge to be trapped, and a non-use bit area disposed in proximity to the other of the first and the second source/drain areas, the non-use bit area being not in use for storing data, wherein the use bit area and the non-use bit area of the trap layer are switched at every specified number of rewriting operations, and wherein in the erasing operation mode, from the state where electric charge is trapped in the use bit area and the non-use bit area, new use bit areas of the plurality of memory cells are erased, and new non-use bit areas thereof are kept in the electric charge trapped state.

9. The nonvolatile memory according to claim 8, further comprising a use bit determining memory for determining which area of the trap layer is the use bit area, and wherein when the use bit area and the non-use bit area are switched, the data of the use bit determining memory is reversed.

10. The nonvolatile memory according to claim 9, wherein in an erasing operation mode, at least the non-use bit area is put in the erased state and the data of the use bit determining memory is rewritten.

11. The nonvolatile memory according to claim 9, wherein in at least one of the erasing operation mode, writing operation mode and read-out operation mode, the use bit area is determined depending on the data of the use bit determining memory.

12. The nonvolatile memory according to claim 8, wherein in the erasing operation mode, from the state where electric charge is trapped in the use bit area and the non-use bit area, both the bit areas of the plurality of memory cells are erased, and writing is performed to a new non-use bit area, for putting the new non-use bit area in the electric charge trapped state.

13. The nonvolatile memory according to claim 8, wherein in the erasing operation mode, from the state where electric charge is trapped in the use bit area and the non-use bit area, both the bit areas of the plurality of memory cells are erased, and wherein in the writing operation mode, writing is performed to a new use bit area, for putting the new use bit area in the electric charge trapped state.

14. The nonvolatile memory according to claim 8, wherein in the erasing operation mode, from the state where the electric charge is trapped in the use bit area, the use bit areas of the plurality of memory cells are erased.

15. The nonvolatile memory according to claim 8, wherein in the erasing operation mode, from the state where the electric charge is trapped in the use bit area and the non-use bit area, both the bit areas of the plurality of memory cells are erased.

16. The nonvolatile memory according to claim 14 or 15, further comprising a use bit determining memory for determining which area of the trap layer is the use bit area, and wherein in the erasing operation mode, the data of the use bit determining memory is reversed.

* * * * *